(12) United States Patent
Chang et al.

(10) Patent No.: US 8,902,135 B2
(45) Date of Patent: Dec. 2, 2014

(54) PIXEL STRUCTURE OF ORGANIC ELECTROLUMINESCENCE DEVICE

(75) Inventors: Yang-Hui Chang, Hsinchu County (TW); Nae-Jye Hwang, Hsinchu (TW); Shen-Tai Liaw, Hsinchu (TW)

(73) Assignee: Integrated Digital Technologies, Inc., Hsinchu (TW)

( * ) Notice: Subject to any disclaimer, the term of this patent is extended or adjusted under 35 U.S.C. 154(b) by 414 days.

(21) Appl. No.: 13/366,270

(22) Filed: Feb. 4, 2012

(65) Prior Publication Data

US 2013/0201085 A1    Aug. 8, 2013

(51) Int. Cl.
*G09G 3/30*    (2006.01)

(52) U.S. Cl.
USPC .......................... 345/76; 345/173; 315/169.3

(58) Field of Classification Search
CPC . G09G 3/3258; G09G 3/3233; G09G 3/3275; G09G 3/3266; G09G 3/3208
USPC ...................... 345/74.1, 76, 82, 84, 204, 211; 315/169.3
See application file for complete search history.

(56) References Cited

U.S. PATENT DOCUMENTS

| | | | | |
|---|---|---|---|---|
| 7,915,617 | B2 * | 3/2011 | Ogura et al. ................. | 257/77 |
| 2002/0000576 | A1 * | 1/2002 | Inukai ........................ | 257/202 |
| 2007/0152180 | A1 * | 7/2007 | Tseng et al. ................. | 250/591 |
| 2012/0313913 | A1 * | 12/2012 | Shiraki et al. .............. | 345/207 |

FOREIGN PATENT DOCUMENTS

| | | |
|---|---|---|
| JP | 2009-244638 | 10/2009 |
| JP | 2009-283676 | 12/2009 |
| JP | 2011-102960 | 5/2011 |

OTHER PUBLICATIONS

"Office Action of Japan Counterpart Application", issued on Jan. 7, 2014, p .1-p. 3, in which the listed references(Ref. 1-3) were cited.
"Office Action of Korean Counterpart Application", issued on Mar. 4, 2014, with English translation thereof, p. 1-p. 7, in which the listed reference(Ref. 1) was cited.

* cited by examiner

*Primary Examiner* — Abbas Abdulselam
*Assistant Examiner* — Gerald Oliver
(74) *Attorney, Agent, or Firm* — Jianq Chyun IP Office

(57) ABSTRACT

A pixel structure of an organic electroluminescence device includes a scan line, and a data line, a bias line and a readout line on a substrate, a first switch device, a capacitor, a driving device, an organic light emitting device, a second switch device and a photo sensor device. The first switch device is electrically connected to the scan line and the data line. The capacitor is electrically connected to the first switch device and the bias line. The driving device is electrically connected to the first switch device, the capacitor and the bias line. The organic light emitting device is electrically connected to the driving device. The second switch device is electrically connected to the scan line and the readout line. The photo sensor device is electrically connected to the second switch device and the bias line.

20 Claims, 13 Drawing Sheets

PIXEL STRUCTURE OF ORGANIC ELECTROLUMINESCENCE DEVICE

BACKGROUND OF THE INVENTION

1. Field of the Invention

The present invention relates to a pixel structure. More particularly, the present invention relates to a pixel structure of an organic electroluminescence device.

2. Description of Related Art

As an emissive device, the organic electroluminescence device has the advantages of no view angle limit, low fabrication cost, high response speed (about more than one hundred times faster than the response speed of the liquid crystal), power saving, adaptability to direct current driving in portable devices, broad operating temperature range, light weight, as well as providing miniature and low-profile design Therefore, the organic electroluminescence device has a great development potential and is expected to be the next generation of flat panel display.

In addition, the electronic products such as mobile phones, handheld personal computers (PCs), personal digital assistants (PDAs) and smart phones have pervaded everywhere in our daily life. To meet current demands on portable, compact, and user-friendly information technology (IT) products, touch sensing display panels have been introduced as input devices in replacement of conventional keyboards or mice. Among the touch sensing display panels, a touch sensing display panel capable of performing both a touch sensing function and a display function is one of the most popular products at present.

Therefore, the organic electroluminescence device having the touch sensing function is developed.

SUMMARY OF THE INVENTION

Accordingly, the present invention is directed to a pixel structure of an organic electroluminescence device having the touch sensing function.

A pixel structure of an organic electroluminescence device includes a scan line, and a data line, a bias line and a readout line on a substrate, a first switch device, a capacitor, a driving device, an organic light emitting device, a second switch device and a photo sensor device is provided. The first switch device is electrically connected to the scan line and the data line. The capacitor is electrically connected to the first switch device and the bias line. The driving device is electrically connected to the first switch device, the capacitor and the bias line. The organic light emitting device is electrically connected to the driving device. The second switch device is electrically connected to the scan line and the readout line. The photo sensor device is electrically connected to the second switch device and the bias line.

A pixel structure of an organic electroluminescence device includes a substrate, a first conductive layer, a first insulating layer, a semiconductor layer, a second conductive layer, a second insulating layer, a third conductive layer, an organic light emitting layer and an upper electrode. The first conductive layer is disposed on the substrate and comprises a first gate, a second gate, a third gate and a first electrode. The first insulating layer covers the first conductive layer. The semiconductor layer is disposed on the first insulating layer and comprises a first channel, a second channel, a third channel and a fourth channel. The second conductive layer is disposed on the semiconductor layer and comprises a first source, a first drain, a second source, a second drain, a third source, a third drain, a fourth source, a fourth drain and a second electrode. The first gate, the first channel, the first source and the first drain form a first switch device. The second gate, the second channel, the second source and the second drain form a driving device. The third gate, the third channel, the third source and the third drain form a second switch device. The first electrode and the second electrode form a capacitor. The second insulating layer covers the second conductive layer. The third conductive layer is disposed on the second insulating layer and comprises a fourth gate and a bottom electrode. The fourth gate, the fourth channel, the fourth source and the fourth drain form a photo sensor device. The bottom electrode is electrically connected to the second drain. The third insulating layer is disposed on the third conductive layer and exposes the bottom electrode. The organic light emitting layer is disposed on the exposed bottom electrode. The upper electrode is disposed on the organic light emitting layer.

A pixel structure of an organic electroluminescence device includes a substrate, a first conductive layer, a first insulating layer, a semiconductor layer, a second conductive layer, a second insulating layer, a bottom electrode, an organic light emitting layer and an upper electrode. The first conductive layer is disposed on the substrate and comprises a first gate, a second gate, a third gate, a fourth gate and a first electrode. The first insulating layer covers the first conductive layer. The semiconductor layer is disposed on the first insulating layer and comprises a first channel, a second channel, a third channel and a fourth channel. The second conductive layer is disposed on the semiconductor layer and comprises a first source, a first drain, a second source, a second drain, a third source, a third drain, a fourth source, a fourth drain and a second electrode. The first gate, the first channel, the first source and the first drain form a first switch device. The second gate, the second channel, the second source and the second drain form a driving device. The third gate, the third channel, the third source and the third drain form a second switch device. The fourth gate, the fourth channel, the fourth source and the fourth drain form a photo sensor device. The first electrode and the second electrode form a capacitor. The second insulating layer covers the second conductive layer. The bottom electrode is disposed on the second insulating layer and electrically connected to the second drain. The third insulating layer is disposed on the second insulating layer and exposes the bottom electrode. The organic light emitting layer is disposed on the exposed bottom electrode. The upper electrode is disposed on the organic light emitting layer.

In light of the foregoing, the pixel structure has the organic light emitting device and the photo sensor device therein, and thus the organic electroluminescence device has the touch sensing function.

In order to make the aforementioned and other features and advantages of the present invention more comprehensible, several embodiments accompanied with figures are described in detail below.

BRIEF DESCRIPTION OF THE DRAWINGS

The accompanying drawings constituting a part of this specification are incorporated herein to provide a further understanding of the invention. Here, the drawings illustrate embodiments of the invention and, together with the description, serve to explain the principles of the invention.

DESCRIPTION OF EMBODIMENTS

Figure 1:
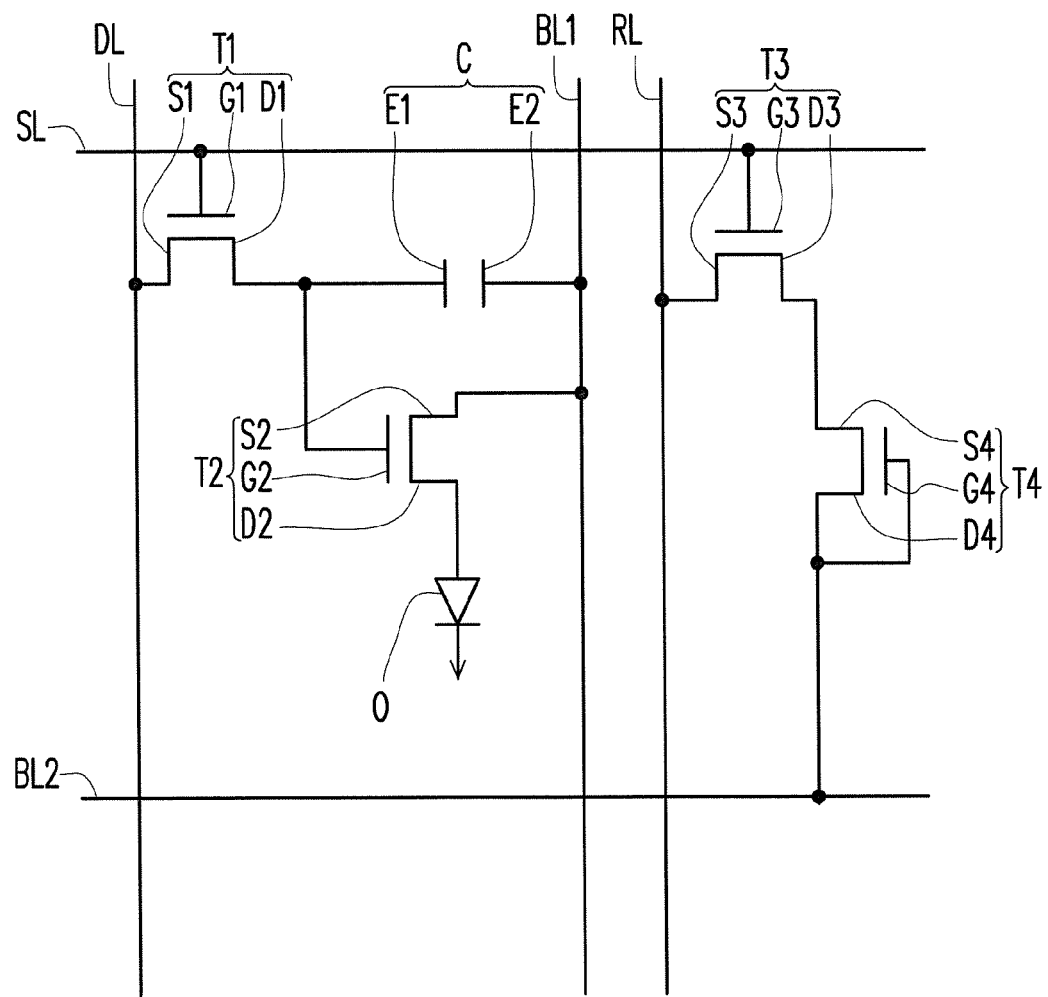
FIG. 1 shows an equivalent circuitry of a pixel structure according to an embodiment of the present invention.

FIG. 1 shows an equivalent circuitry of a pixel structure according to an embodiment of the present invention. Referring to FIG. 1, the pixel structure includes a scan line SL, a data line DL, a first bias line BL1, a second bias line BL2, a readout line RL, a first switch device T1, a capacitor C, a driving device T2, an organic light emitting device O, a second switch device T3 and a photo sensor device T4. The first switch device T1 is electrically connected to the scan line SL and the data line DL. The capacitor C is electrically connected to the first switch device T1 and the first bias line BL1. The driving device T2 is electrically connected to the first switch device T1, the capacitor C and the first bias line BL1. The organic light emitting device O is electrically connected to the driving device T2. The second switch device T3 is electrically connected to the scan line SL and the readout line RL. The photo sensor device T4 is electrically connected to the second switch device T3 and the second bias line BL2.

The first switch device T1, the driving device T2, the second switch device T3 and the photo sensor device T4 may respectively be a bottom gate thin film transistor or a top gate thin film transistor. The first switch device T1, the driving device T2, the second switch device T3 and the photo sensor device T4 may also respectively be an amorphous thin film transistor or low temperature poly-silicon (LTPS) thin film transistor. The organic light emitting device O may be a bottom emission organic light emitting device, a top emission organic light emitting device or a dual emission organic light emitting device. In order to clearly illustrate the pixel structure of the invention, a pixel structure with the organic light emitting device O (bottom emission), the first switch device T1 (bottom gate thin film transistor), the driving device T2 (bottom gate thin film transistor), the second switch device T3 (bottom gate thin film transistor) and the photo sensor device T4 (top gate thin film transistor) is described, but it does not limit the present invention.

Figure 2:
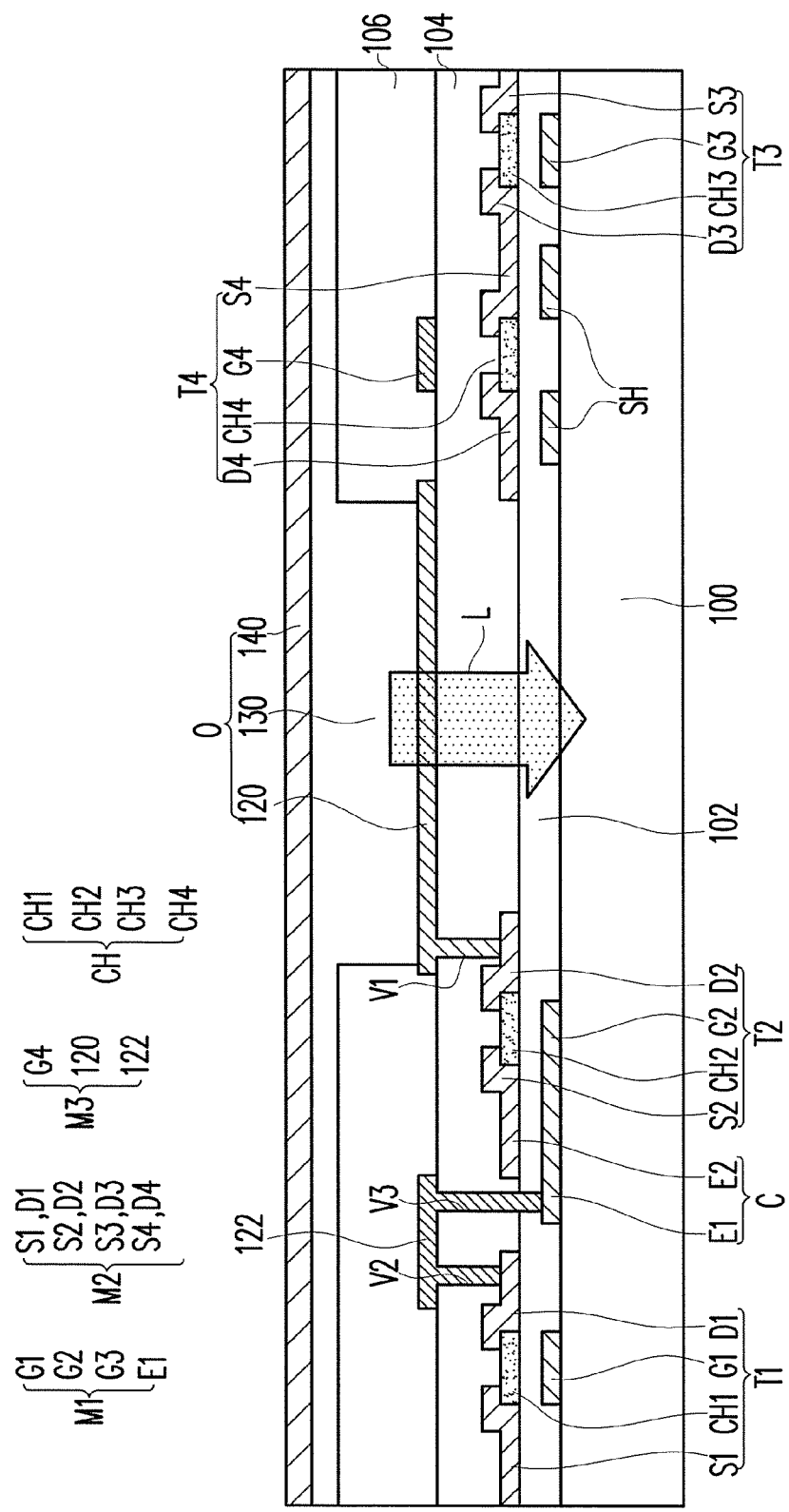
FIG. 2 is a cross-sectional view of a pixel structure according to an embodiment of the present invention.
Figure 3:
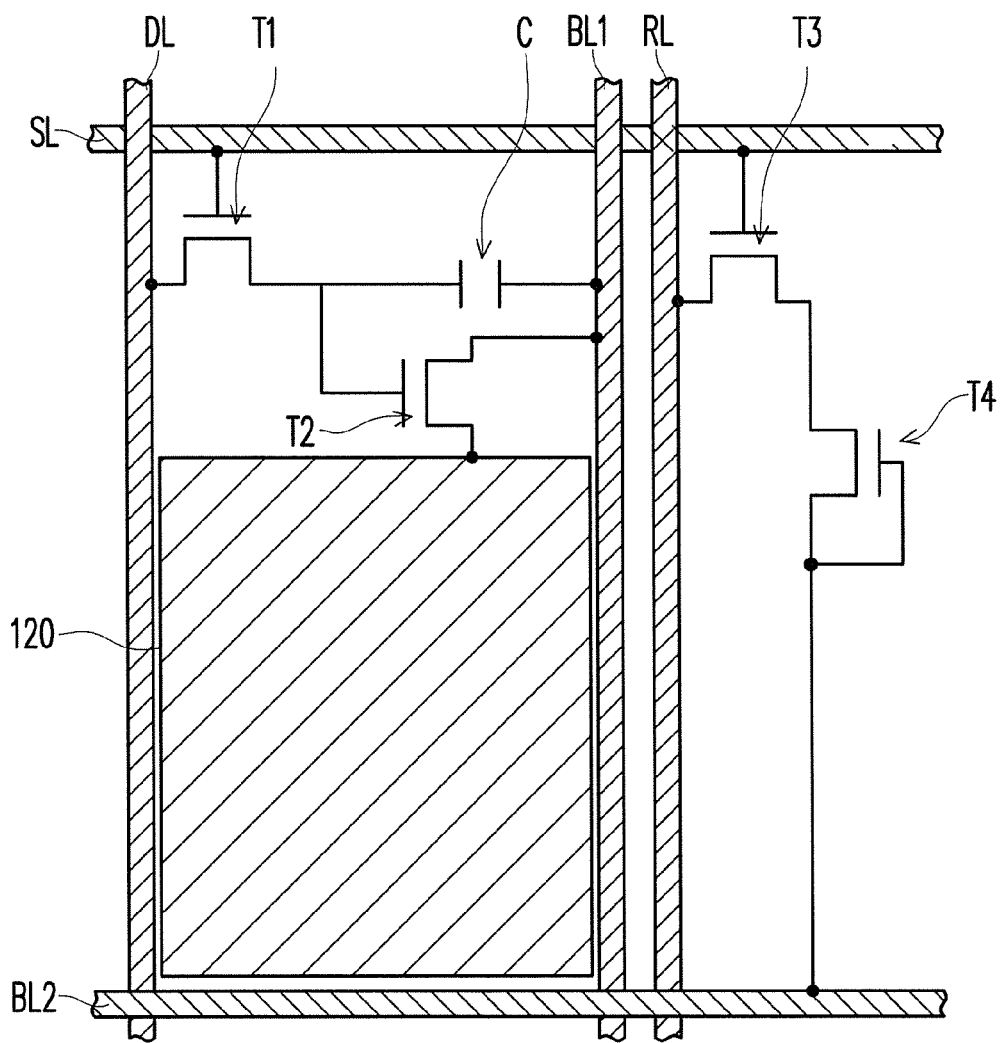
FIG. 3 is a diagram showing a top view of a pixel structure according to an embodiment of the present invention.

FIG. 2 is a cross-sectional view of a pixel structure according to an embodiment of the present invention. FIG. 3 is a diagram showing a top view of a pixel structure according to an embodiment of the present invention, and the organic light emitting layer and the upper electrode layer of the pixel structure is not shown for illustration. Referring to FIG. 1, FIG. 2 and FIG. 3, the pixel structure includes a substrate 100, a first conductive layer M1, a first insulating layer 102, a semiconductor layer CH, a second conductive layer M2, a second insulating layer 104, a third conductive layer M3, an organic light emitting layer 130 and an upper electrode 140.

The substrate 100 may be a rigid substrate, such as a glass substrate or a silicon substrate, or a flexible substrate, such as a polymer substrate or a plastic substrate.

The first conductive layer M1 is disposed on the substrate 100 and comprises a first gate G1, a second gate G2, a third gate G3 and a first electrode E1. The first conductive layer M1 comprises a metallic material or other suitable conductive materials. According to the embodiment, the first conductive layer M1 further comprises a scan line SL (shown in FIG. 1) electrically connected to the first gate G1.

The first insulating layer 102 covers the first conductive layer M1. The first insulating layer 102 comprises an inorganic insulating material, such as silicon oxide, silicon nitride or silicon oxynitride, or an organic insulating material.

The semiconductor layer CH is disposed on the first insulating layer 102 and comprises a first channel CH1 above the first gate G1, a second channel CH2 above the second gate G2, a third channel CH3 above the third gate G3 and a fourth channel CH4. According to the embodiment, the first channel CH1 is disposed directly above the first gate G1, the second channel CH2 is disposed directly above the second gate G2, and the third channel CH3 is disposed directly above the third gate G3. In addition, the semiconductor layer CH comprises amorphous silicon, poly-silicon, micro-crystal silicon or other suitable semiconductor materials.

The second conductive layer M2 is disposed on the semiconductor layer CH and comprises a first source S1, a first drain D1, a second source S2, a second drain D2, a third source S3, a third drain D3, a fourth source S4, a fourth drain D4 and a second electrode E2. The first source S1 and the first drain D1 are disposed on the first channel CH1. The second source S2 and the second drain D2 are disposed on the second channel CH2. The third source S3 and the third drain D3 are disposed on the third channel CH3. The fourth source S4 and the fourth drain D4 are disposed on the fourth channel CH4. The second electrode E2 is disposed above the first electrode E1.

Accordingly, the first gate G1, the first channel CH1, the first source S1 and the first drain D1 form a first switch device T1. The second gate G2, the second channel CH2, the second source S2 and the second drain D2 form a driving device T2. The third gate G3, the third channel CH3, the third source S3 and the third drain D3 form a second switch device T3. The first electrode E1 and the second electrode E2 form a capacitor C. In the embodiment, the first drain D1 of the first switch device T1 is electrically connected to the first electrode El of the capacitor C and the second gate G2 of the driving device T2. The third drain D3 of the second switch device T3 is electrically connected to the fourth source S4.

In addition, the second conductive layer M2 further comprises a data line DL, a readout line RL and a first bias line BL1. The data line DL is electrically connected to the first source Si of the first switch device T1. The readout line RL is electrically connected to the third source S3 of the second switch device T3. The first bias line BL1 is electrically connected to the second electrode E2 of the capacitor C and the second source S2 of the driving device T2. The data line DL, the readout line RL and the first bias line BL1 are disposed crossing over the scan line SL. In the embodiment, the data line DL, the readout line RL and the first bias line BL1 are parallel to one another. In other words, an extending direction of the data line DL, the readout line RL and the first bias line BL1 is not parallel to an extending direction of the scan line SL. In the embodiment, the extending direction of the data line DL, the readout line RL and the first bias line BL1 is perpendicular to the extending direction of the scan line SL, but it does not limit the present invention.

In addition, as shown in FIG. 3, the readout line RL is disposed between the first bias line BL1 and the photo sensor device T4 (and the second switch device T3). In other words, the photo sensor device T4 (the second switch device T3) is disposed between the readout line RL and a next data line (not shown) of a next pixel structure.

The second insulating layer 104 covers the second conductive layer M2. The second insulating layer 104 comprises an inorganic insulating material, such as silicon oxide, silicon nitride or silicon oxynitride, or an organic insulating material.

The third conductive layer M3 is disposed on the second insulating layer 104 and comprises a fourth gate G4 and a bottom electrode 120. The fourth gate G4 is disposed above the fourth channel CH4, and the fourth gate G4 is electrically connected to the fourth drain D4. The fourth gate G4, the fourth channel CH4, the fourth source S4 and the fourth drain D4 form a photo sensor device T4. The bottom electrode 120 is electrically connected to the second drain D2 of the driving device T2 through the contact via V1 formed in the second insulating layer 104.

In the embodiment, the third conductive layer M3 further comprises a connecting pattern 122 to electrically connect the first drain D1 of the first switch device T1 and the first electrode E1 of the capacitor C. For detail, the connecting pattern 122 is disposed on the second insulating layer 104 and a contact via V2 and a contact via V3 are formed in the second insulating layer 104. The first drain D1 of the first switch device T1 and the first electrode E1 of the capacitor C are electrically connected to each other through the connecting pattern 122, the contact via V2 and the contact via V3.

In addition, the third conductive layer M3 further comprises a second bias line BL2 electrically connected to the fourth gate G4 and the fourth drain D4 (as shown in FIG. 1 and FIG. 3). The second bias line BL2 is disposed crossing over the data line DL, the readout line RL and the first bias line BL1. In the embodiment, the second bias line BL2 is parallel to the scan line SL and is perpendicular to the data line DL, the readout line RL and the first bias line BL1.

The third conductive layer M3 is a transparent conductive layer comprising Indium Tin Oxide (ITO) or Indium Zinc Oxide (IZO), for example. Since the third conductive layer M3 is a transparent conductive layer, the bottom electrode 120 is a transparent electrode.

The third insulating layer 106 is disposed on the third conductive layer M3 and exposes the bottom electrode 120. The third insulating layer 106 comprises an inorganic insulating material, such as silicon oxide, silicon nitride or silicon oxynitride, or an organic insulating material.

The organic light emitting layer 130 is disposed on the exposed bottom electrode 120. The organic light emitting layer 130 may comprise a red organic light emitting material, a green organic light emitting material or a blue organic light emitting material. The organic light emitting layer 130 may also comprise an electron injection layer, an electron transport layer, a hole injection layer, a hole transport layer or a combination thereof. In some examples of the present invention, the touch sensing light source (not shown) can be designed within the organic light emitting layer 130, or formed in an independent layer. The wavelength of the touch sensing light is different from the one of the visible organic light emitting material, for example, it may be an infrared or other invisible light.

The upper electrode 140 is disposed on the organic light emitting layer 130, and the upper electrode 140, the organic light emitting layer 130 and the bottom electrode 120 form an organic light emitting device O. The upper electrode 140 comprises a reflective electrode material or a transparent electrode material. If the upper electrode 140 is a reflective electrode, the light L emitted from the organic light emitting layer 130 may pass though the bottom electrode 120 and the substrate 100, such that the organic light emitting device O is a bottom emission organic light emitting device. If the upper electrode 140 is a transparent electrode, the light emitted from the organic light emitting layer 130 may pass though the bottom electrode 120 and the substrate 100 and also pass through the upper electrode 140, such that the organic light emitting device O is a dual emission organic light emitting device.

Accordingly, the first switch device T1, the driving device T2 and the organic light emitting device O are controlled by the scan line SL, the data line DL and the first bias line BL1, such that the pixel structure may be driven to emit the light L or not. In addition, the second switch device T3 and the photo sensor device T4 are electrically connected to the readout line RL and the second bias line BL2. When a photo sensing signal from the bottom of the pixel structure passes through the substrate 100, it may be sensed or received by the photo sensor device T4 and transmitted to the readout line RL, such that the pixel structure has the touch sensing function.

It is noted that in the embodiment of FIG. 2, since the organic light emitting device O is a bottom emission organic light emitting device or a dual emission organic light emitting device, the light L emitted from the organic light emitting device O may emit to the fourth channel CH4 of the photo sensor device T4. In the embodiment, the first conductive layer M1 may further comprise a light shielding pattern SH, such as a black matrix, disposed under the photo sensor device T4. The light shielding pattern SH disposed under the photo sensor device T4 can shield the light L emitting into the fourth channel CH4 (active layer) of the photo sensor device T4, so as to prevent the light L from interfering the photo sensing function of the photo sensor device T4. In the embodiment, the light shielding pattern SH is disposed corresponding to the fourth channel CH4 of the photo sensor device T4 to only allow the collimation light of the photo sensing signal from the external light source, such as a light pen. Therefore, the photo sensing signal from the bottom of the pixel structure and passing through the substrate 100 can still be sensed or received by the fourth channel CH4 of the photo sensor device T4.

Figure 4:
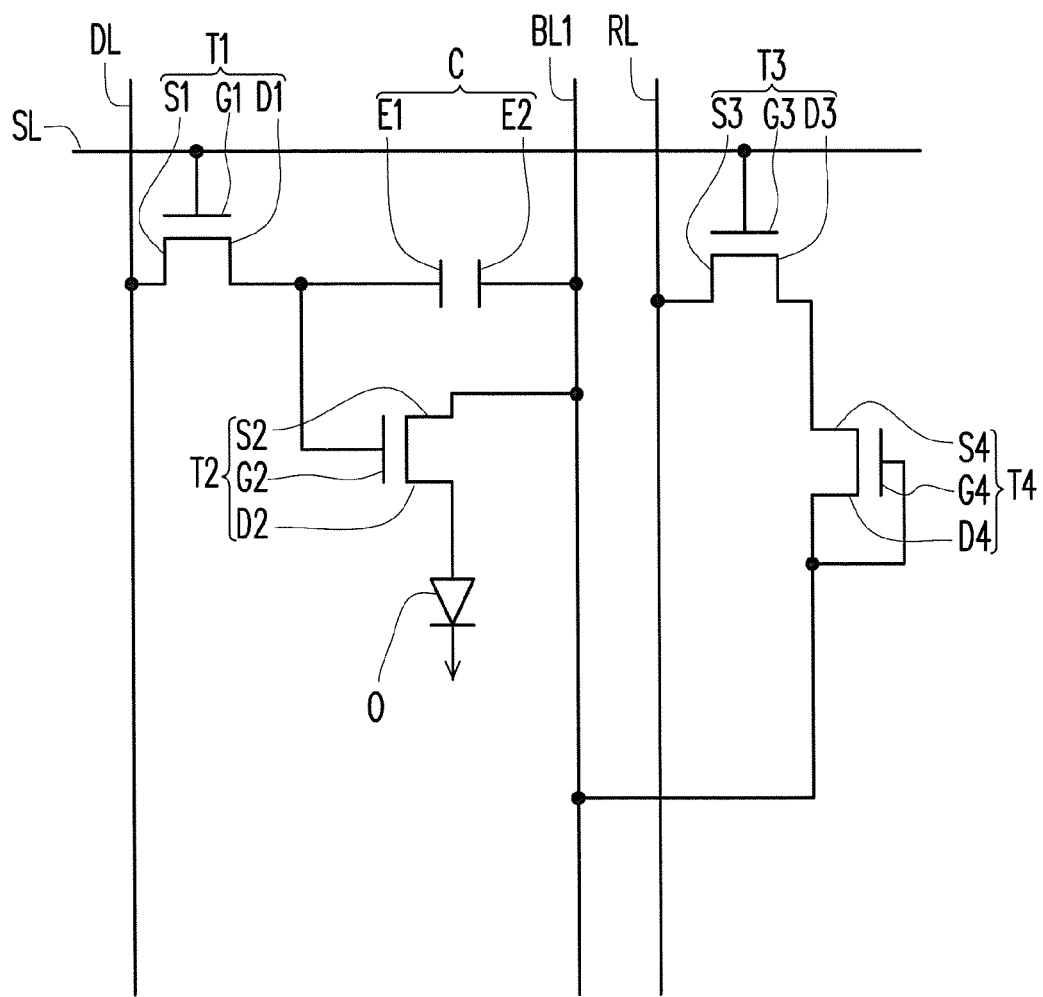
FIG. 4 and FIG. 5 are equivalent circuitry diagrams of a pixel structure according to other embodiments of the present invention.

FIG. 4 is equivalent circuitry diagram of a pixel structure according to other embodiments of the present invention. Referring to FIG. 4, the embodiment is similar to the embodiment shown in FIG. 1. Thus, identical components will be denoted with the same numerals and not repeated herein. The difference between the embodiment of FIG. 4 and the embodiment of FIG. 1 lies in that the pixel structure of FIG. 4 has only one bias line BL1. The bias line BL1 is disposed parallel to the data line DL and the readout line RL. The second electrode E2 of the capacitor C and the second source S2 of the driving device T2 are electrically connected the bias line BL1, and the fourth gate G4 and the fourth drain D4 are also electrically connected to the bias line BL1.

Figure 5:
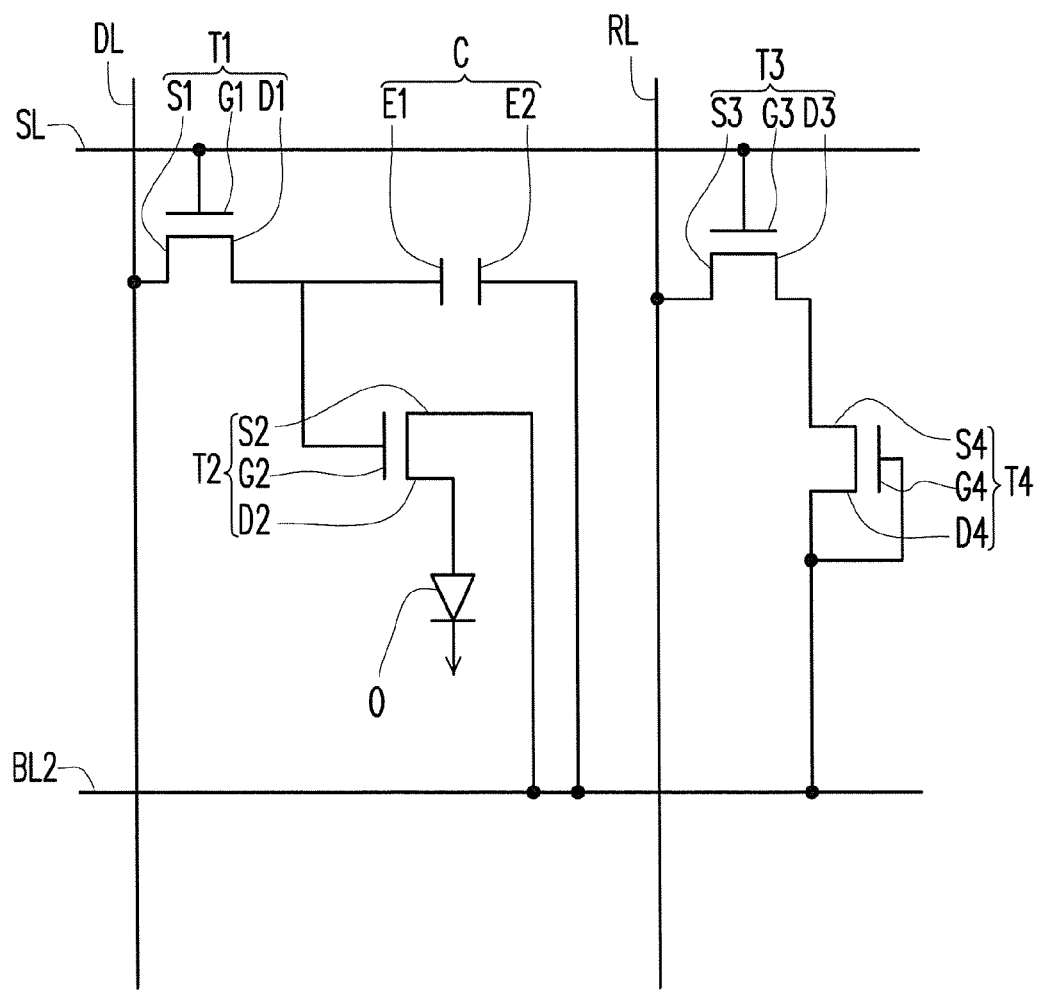

FIG. 5 is equivalent circuitry diagram of a pixel structure according to other embodiments of the present invention. Referring to FIG. 5, the embodiment is similar to the embodiment shown in FIG. 1. Thus, identical components will be denoted with the same numerals and not repeated herein. The difference between the embodiment of FIG. 5 and the embodiment of FIG. 1 lies in that the pixel structure of FIG. 5 has only one bias line BL2. The bias line BL2 is disposed parallel to the scan line SL. The second electrode E2 of the capacitor C and the second source S2 of the driving device T2 are electrically connected the bias line BL2, and the fourth gate G4 and the fourth drain D4 are also electrically connected to the bias line BL2.

Figure 6:
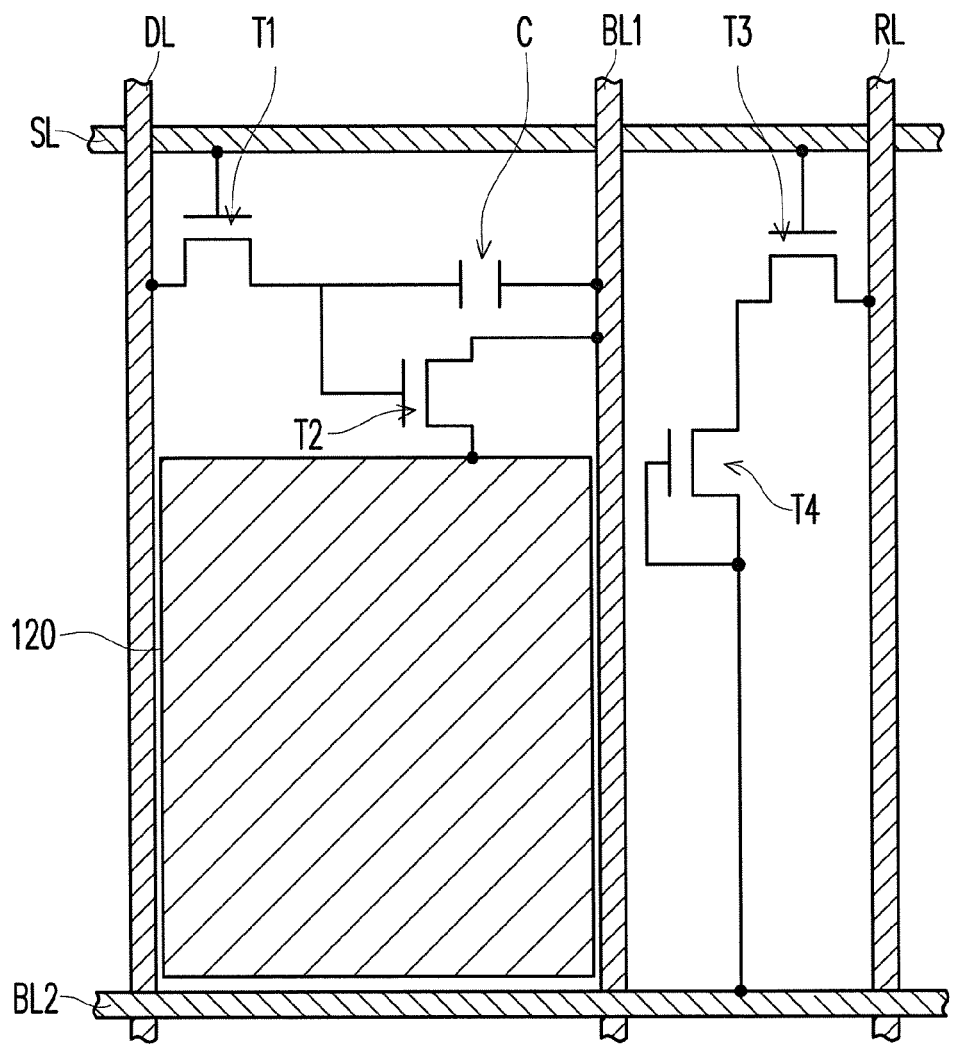
FIG. 6 is a diagram showing a top view of a pixel structure according to another embodiment of the present invention.

FIG. 6 is a diagram showing a top view of a pixel structure according to another embodiment of the present invention. Referring to FIG. 6, the embodiment is similar to the embodiment shown in FIG. 3. Thus, identical components will be denoted with the same numerals and not repeated herein. The difference between the embodiment of FIG. 6 and the embodiment of FIG. 3 lies in that the photo sensor device T4 (and the second switch device T3) is disposed between the first bias line BL1 and the readout line RL.

Figure 7:
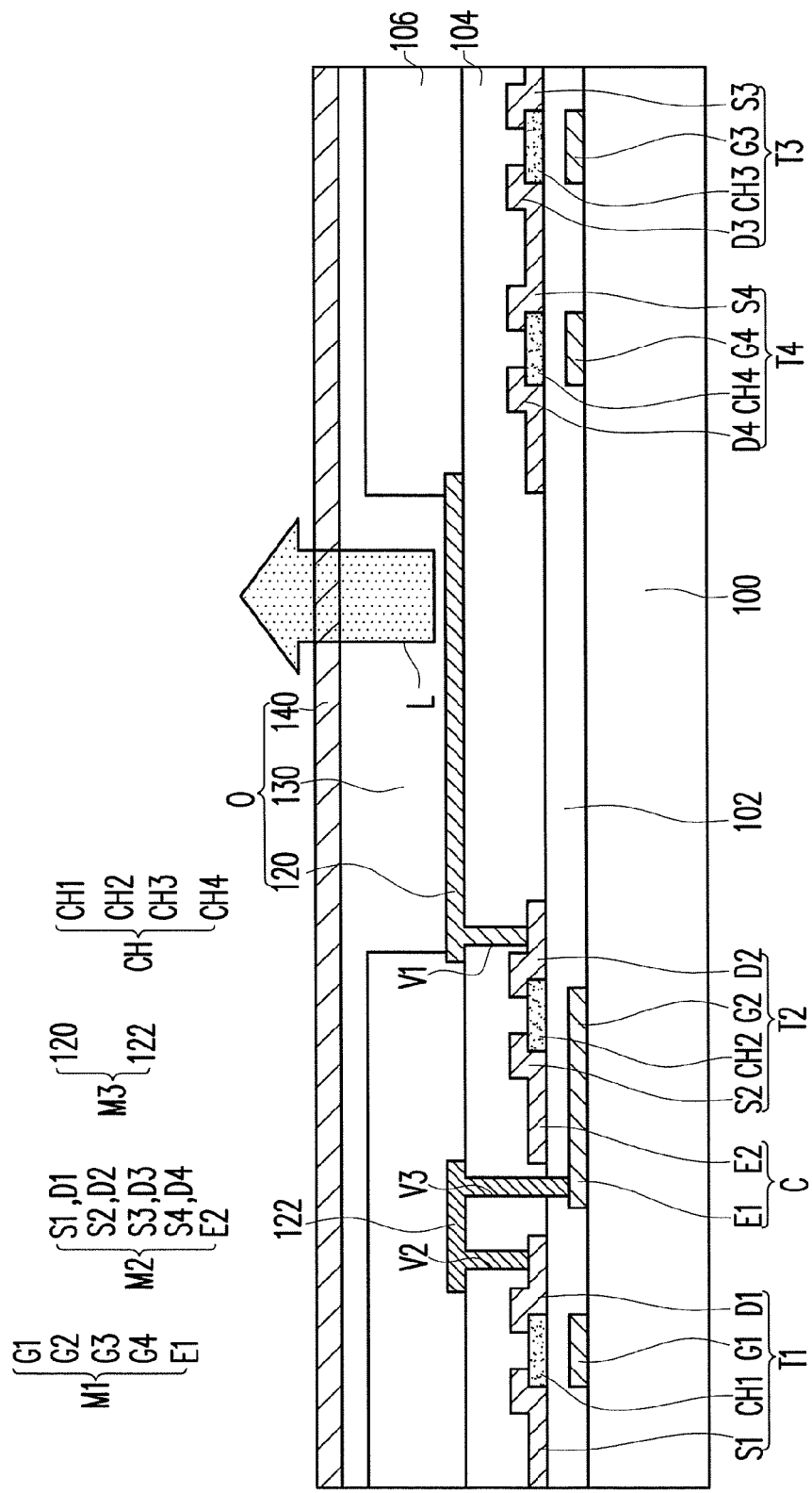
FIG. 7 is a cross-sectional view of a pixel structure according to another embodiment of the present invention.

FIG. 7 is a cross-sectional view of a pixel structure according to another embodiment of the present invention. Referring to FIG. 7, the embodiment is similar to the embodiment shown in FIG. 2. Thus, identical components will be denoted with the same numerals and not repeated herein. Referring to FIG. 7, the organic light emitting device O is a top emission organic light emitting device (or dual emission organic light emitting device) and the photo sensor device T4 is a bottom gate thin film transistor.

For detail, the upper electrode 140 of the organic light emitting device O comprises a transparent electrode material, such as Indium Tin Oxide (ITO) or Indium Zinc Oxide (IZO), and the bottom electrode 120 comprises a reflective electrode material or a transparent electrode material. If the bottom electrode 120 is a reflective electrode, the light L emitted from the organic light emitting layer 130 may pass though the upper electrode 140, such that the organic light emitting device O is a top emission organic light emitting device. If the bottom electrode 120 is a transparent electrode, the light emitted from the organic light emitting layer 130 may pass though the upper electrode 140 and also pass through the bottom electrode 120 and the substrate 100, such that the organic light emitting device O is a dual emission organic light emitting device.

In addition, the photo sensor device T4 is a bottom gate thin film transistor structure. That is, the fourth gate G4 is a part of the first conductive layer M1 on the substrate 100, the fourth channel CH4 is disposed above the fourth gate G4, and the fourth source S4 and the fourth drain D4 are disposed on the fourth channel CH4. Since the fourth gate G4 belongs to the first conductive layer M1, the bias line electrically connected to fourth gate G4 and the fourth drain D4 may also belong to the first conductive layer M1. When a photo sensing signal from the top of the pixel structure passes through the upper electrode 140 and the third insulating layer 106, it is sensed or received by the fourth channel CH4 of the photo sensor device T4. In the embodiment, the light shielding pattern can be omitted because the fourth gate G4 is disposed under the fourth channel CH4 to shield the light L from the organic light emitting layer 130.

Figure 8:
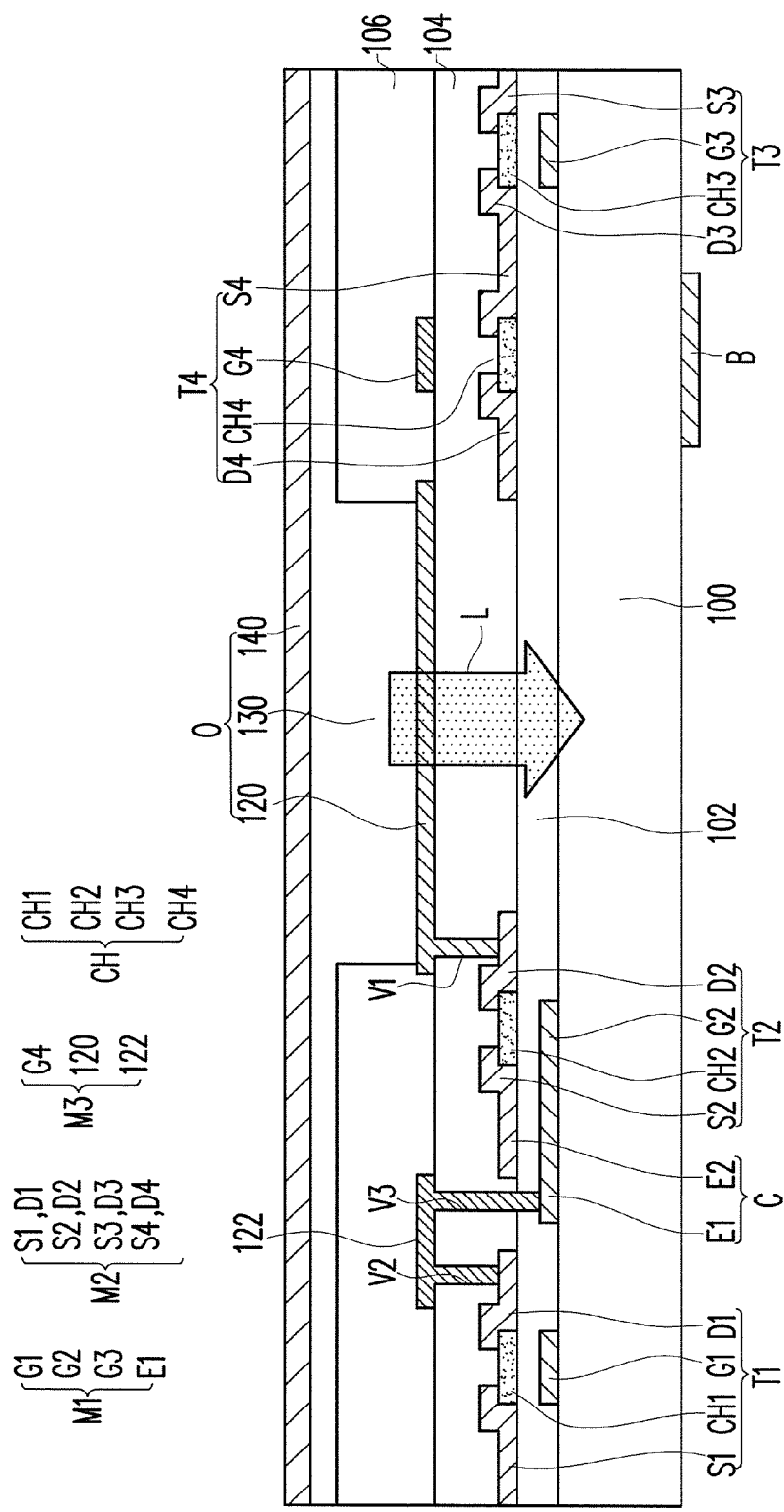
FIGS. 8-11 are cross-sectional views of a pixel structure according to several embodiments of the present invention.

FIGS. 8-11 are cross-sectional views of a pixel structure according to several embodiments of the present invention. As shown in FIG. 8, the embodiment is similar to the embodiment shown in FIG. 2. Thus, identical components will be denoted with the same numerals and not repeated herein. The difference between the embodiment of FIG. 8 and the embodiment of FIG. 2 lies in that the light shielding pattern B is disposed on an outer surface of the substrate 100. For detail, the light shielding pattern B is disposed on the outer surface of the substrate 100 under the photo sensor device T4. The light shielding pattern B may be a color filter pattern or a black resin, for example. The light shielding pattern B is used to allow the specific wavelength to pass through, and enhance the sensing sensitivity of the photo sensor device T4.

Figure 9:
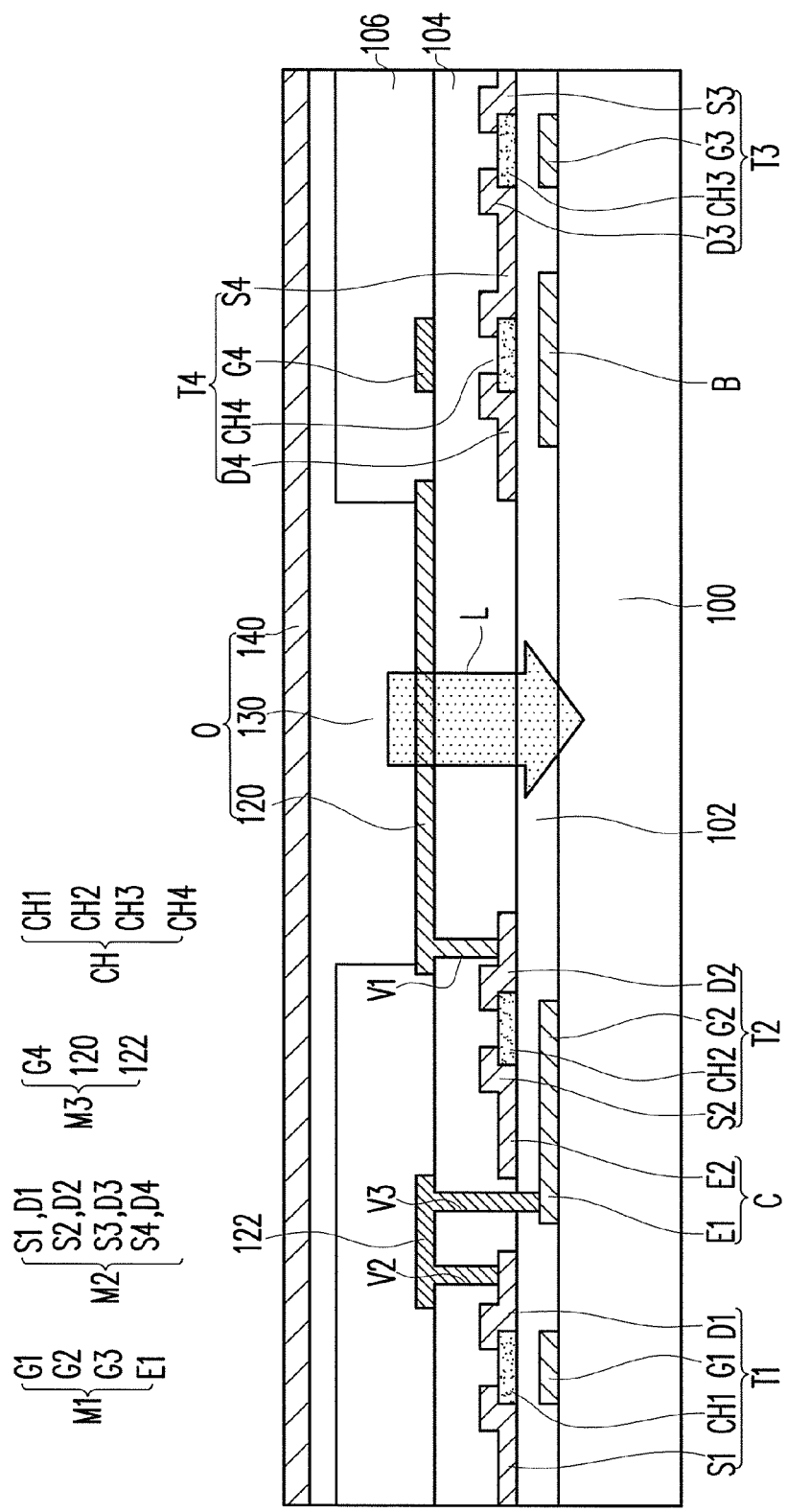

As shown in FIG. 9, the embodiment is similar to the embodiment shown in FIG. 8. Thus, identical components will be denoted with the same numerals and not repeated herein. The difference between the embodiment of FIG. 9 and the embodiment of FIG. 8 lies in that the light shielding pattern B is disposed on an inner surface of the substrate 100. For detail, the light shielding pattern B is disposed between the substrate 100 and the photo sensor device T4. The light shielding pattern B may be a color filter pattern, and shield the photo sensor device T4 from reflected light coming from the surrounding and the light L of the organic light emitting device O, to allow the specific wavelength to pass through and block the interference of the reflected light.

Figure 10:
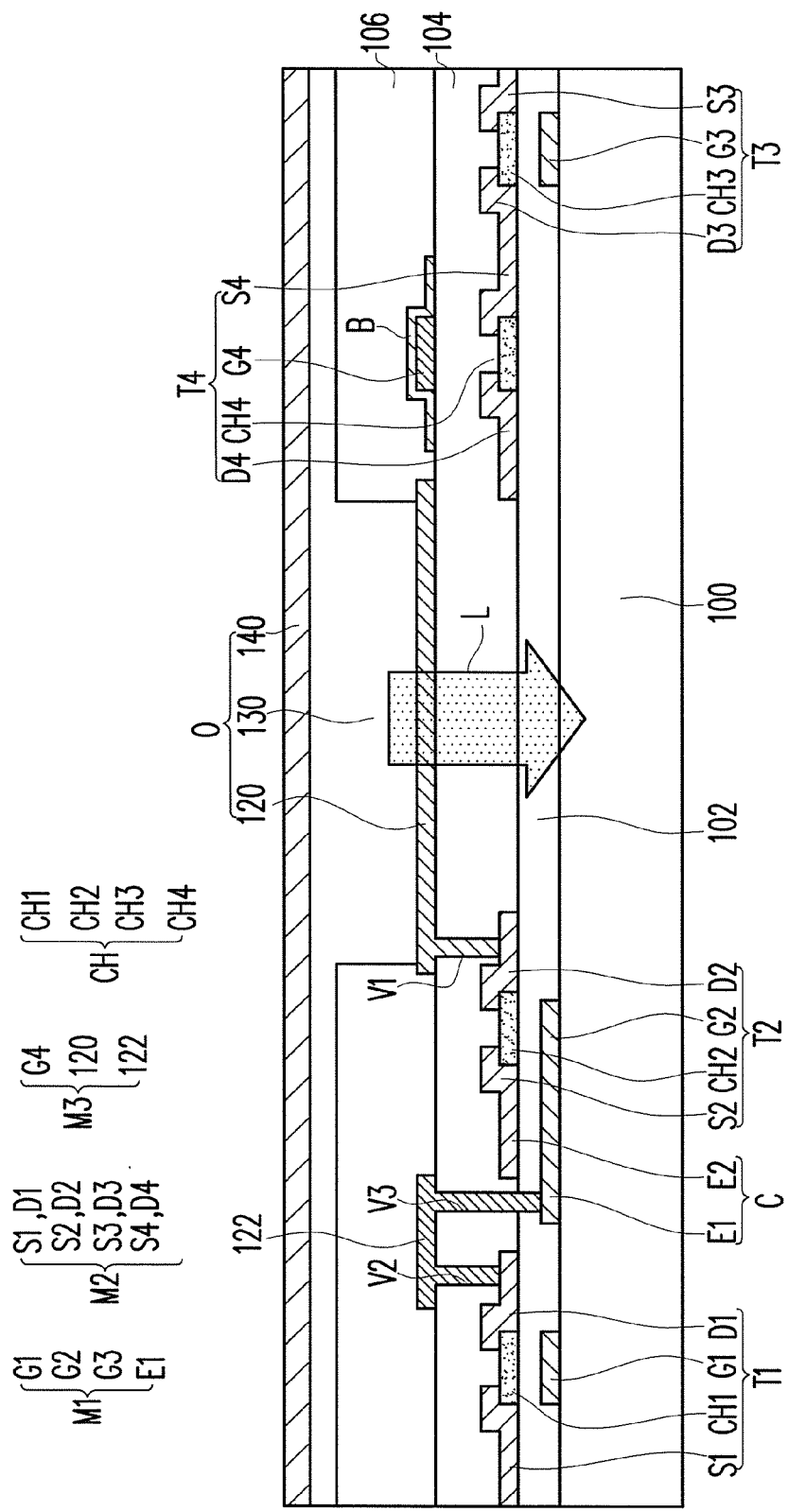

As shown in FIG. 10, the embodiment is similar to the embodiment shown in FIG. 9. Thus, identical components will be denoted with the same numerals and not repeated herein. It is noted that the organic light emitting device O comprises the touching sensing light source, such as infrared or other invisible light, except for the trichromatic light emitting diodes, and the difference between the embodiment of FIG. 10 and the embodiment of FIG. 9 lies in that the light shielding pattern B is disposed on the photo sensor device T4. For detail, the light shielding pattern B covers the gate G4 of the photo sensor device T4. The light shielding pattern B, may be a black resin, and shield the photo sensor device T4 from reflected light L of the organic light emitting device O composed of the infrared light and the invisible light.

Figure 11:
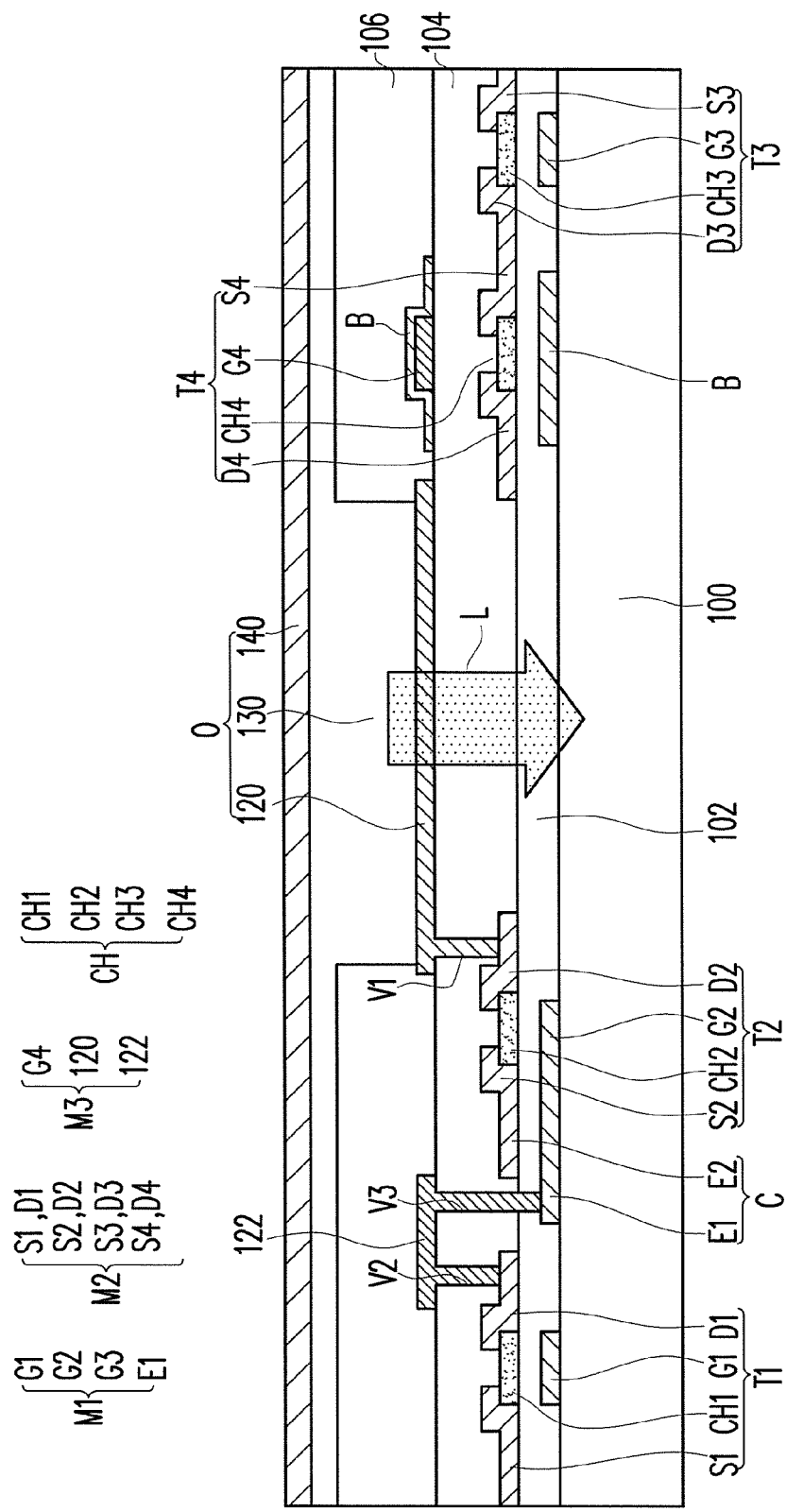

As shown in FIG. 11, the embodiment is similar to the embodiment shown in FIG. 10. Thus, identical components will be denoted with the same numerals and not repeated herein. The difference between the embodiment of FIG. 11 and the embodiment of FIG. 10 lies in that the light shielding pattern B is disposed on the inner surface of the substrate 100 and on the photo sensor device T4. For detail, the light shielding pattern B is disposed between the substrate 100 and the photo sensor device T4 and covers the gate G4 of the photo sensor device T4. The light shielding pattern B may shield the photo sensor device T4 from reflected light coming from the surrounding and the light L of the organic light emitting device O.

Figure 12:
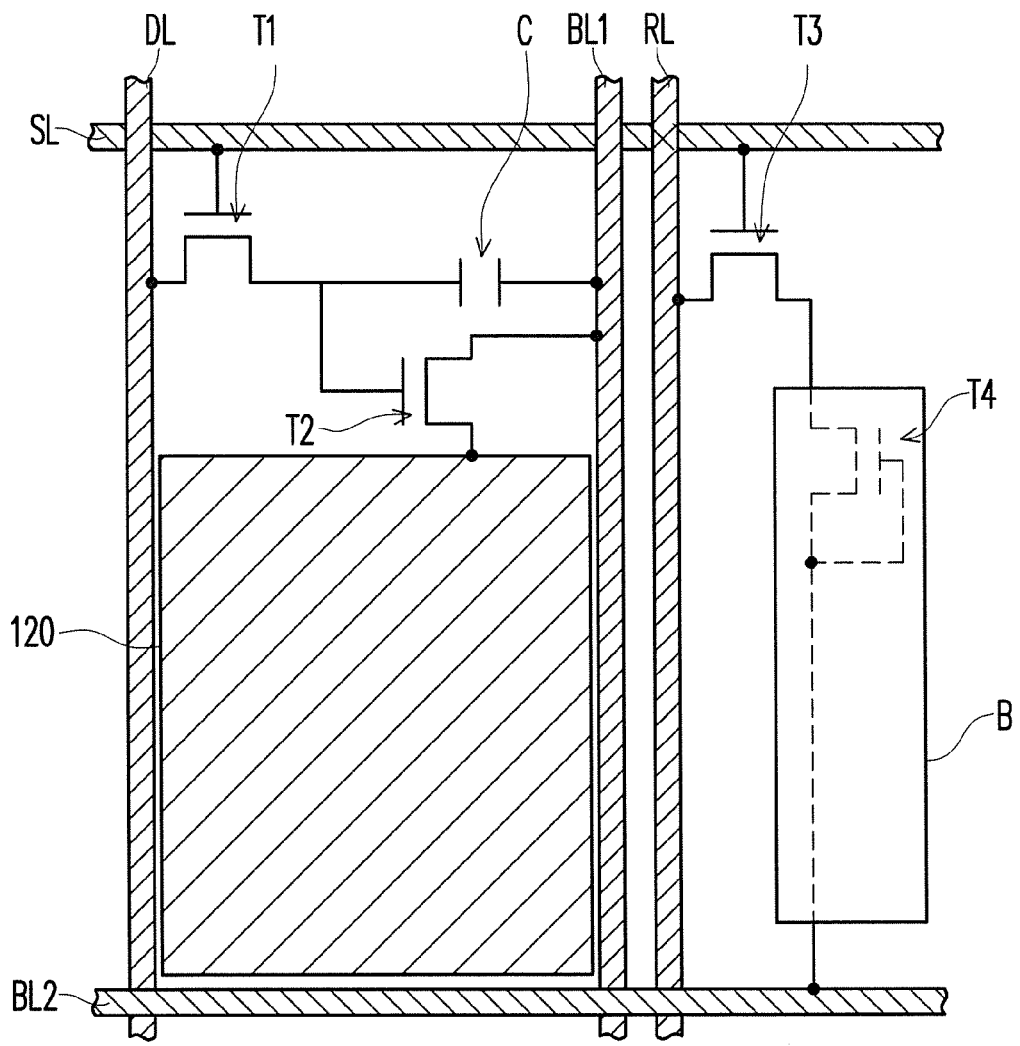
FIGS. 12-13 are diagrams showing a top view of a pixel structure according to embodiments of the present invention.
Figure 13:
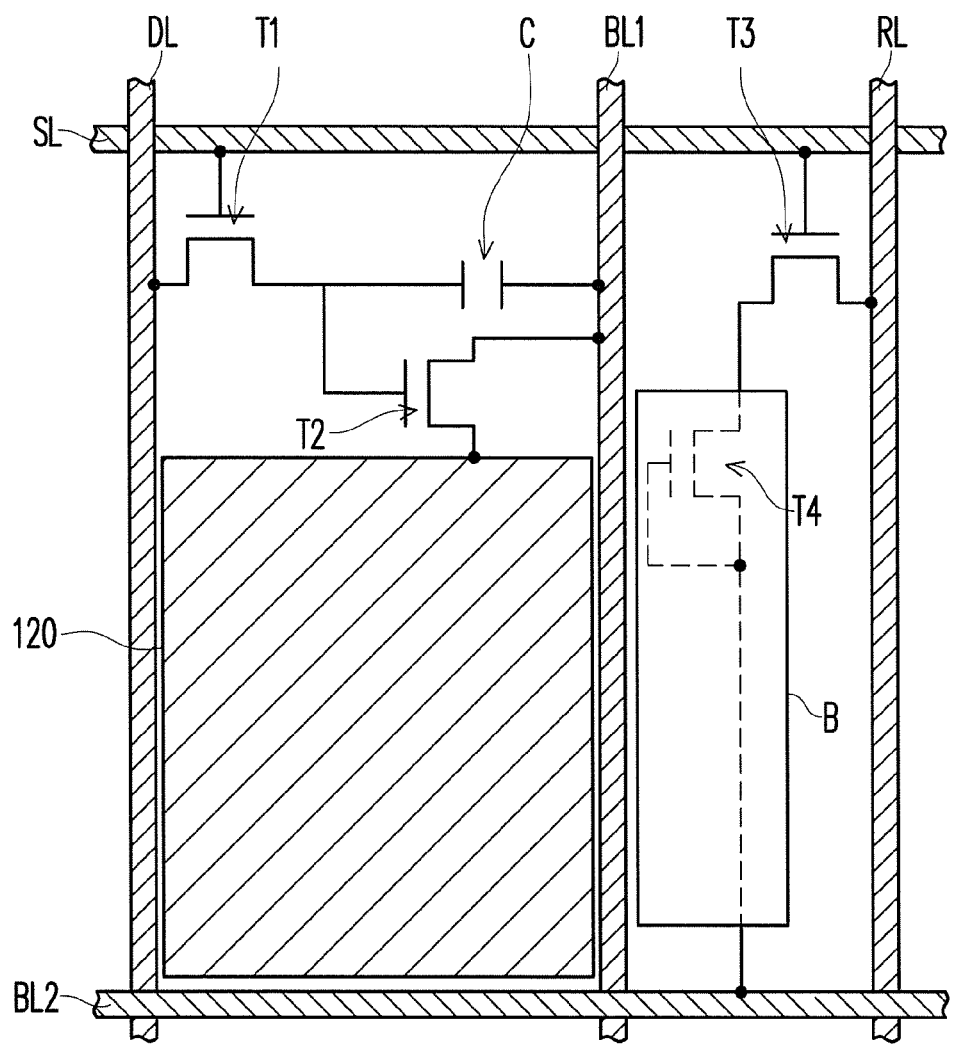

FIGS. 12-13 are diagrams showing a top view of a pixel structure according to embodiments of the present invention. The light shielding pattern B shown in FIG. 8, 9, 10 or 11 is disposed corresponding to the photo sensor device T4, as shown in FIG. 12 and FIG. 13. Namely, the light shielding pattern B mainly covers the photo sensor device T4 and exposes other components of the pixel structure.

In light of the foregoing, since the pixel structure has the organic light emitting device and the photo sensor device therein, the organic electroluminescence device has the touch sensing function. In addition, the manufacturing process of the touch sensing elements (comprising the photo sensor device, the second switch device, the readout line and the bias line) can be compliant with the manufacturing process of the organic light emitting elements (comprising the first switch device, the driving device, the organic light emitting device, the scan line and the data line), and therefore additional processes for the pixel structure are not required.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:
1. A pixel structure of an organic electroluminescence device, comprising:
   a scan line, a data line, a bias line and a readout line, on a substrate;
   a first switch device, electrically connected to the scan line and the data line;
   a capacitor, electrically connected to the first switch device and the bias line;

a driving device, electrically connected to the first switch device, the capacitor and the bias line;
an organic light emitting device, electrically connected to the driving device;
a second switch device, electrically connected to the scan line and the readout line; and
a photo sensor device, electrically connected to the second switch device and the bias line,
wherein the bias line comprises:
a first bias line, disposed parallel to the data line and electrically connected to the capacitor and the driving device; and
a second bias line disposed parallel to the scan line and electrically connected to the photo sensor device.

2. The pixel structure as claimed in claim 1, wherein the photo sensor device is disposed between the first bias line and the readout line.

3. The pixel structure as claimed in claim 1, wherein the readout line is disposed between the first bias line and the photo sensor device.

4. The pixel structure as claimed in claim 1, wherein the organic light emitting device is a bottom emission organic light emitting device, and the photo sensor device is a top gate thin film transistor.

5. The pixel structure as claimed in claim 4, further comprising a light shielding pattern, covering the photo sensor device.

6. The pixel structure as claimed in claim 5, wherein the light shielding pattern is disposed on an outer surface of the substrate, between the substrate and the photo sensor device, on the photo sensor device, or a combination thereof.

7. The pixel structure as claimed in claim 1, wherein the organic light emitting device is a top emission organic light emitting device, and the photo sensor device is a bottom gate thin film transistor.

8. The pixel structure as claimed in claim 1, wherein the first switch device, the driving device and the second switch device are respectively a bottom gate thin film transistor.

9. A pixel structure of an organic electroluminescence device, comprising:
a substrate;
a first conductive layer, disposed on the substrate and comprising a first gate, a second gate, a third gate and a first electrode;
a first insulating layer, covering the first conductive layer;
a semiconductor layer, disposed on the first insulating layer and comprising a first channel, a second channel, a third channel and a fourth channel;
a second conductive layer, disposed on the semiconductor layer and comprising a first source, a first drain, a second source, a second drain, a third source, a third drain, a fourth source, a fourth drain and a second electrode, wherein the first gate, the first channel, the first source and the first drain form a first switch device, the second gate, the second channel, the second source and the second drain form a driving device, the third gate, the third channel, the third source and the third drain form a second switch device, and the first electrode and the second electrode form a capacitor;
a second insulating layer, covering the second conductive layer;
a third conductive layer, disposed on the second insulating layer and comprising a fourth gate and a bottom electrode, the fourth gate, the fourth channel, the fourth source and the fourth drain form a photo sensor device, and the bottom electrode is electrically connected to the second drain of the driving device;
a third insulating layer, disposed on the third conductive layer and exposing the bottom electrode;
an organic light emitting layer, disposed on the bottom electrode; and
an upper electrode, disposed on the organic light emitting layer.

10. The pixel structure as claimed in claim 9, wherein the bottom electrode comprises a transparent electrode material.

11. The pixel structure as claimed in claim 9, wherein the upper electrode comprises a reflective electrode material or a transparent electrode material.

12. The pixel structure as claimed in claim 9, wherein the first conductive layer further comprises a scan line and a light shielding pattern, the scan line is electrically connected to the first gate, and the light shielding pattern is disposed under the fourth channel.

13. The pixel structure as claimed in claim 9, wherein the second conductive layer further comprises a data line, a readout line and a bias line, the data line is electrically connected to the first source, the readout line is electrically connected to the third source, and the bias line is electrically connected to the second electrode and the second source.

14. The pixel structure as claimed in claim 9, wherein the third conductive layer further comprises a bias line electrically connected to the fourth gate and the fourth drain.

15. The pixel structure as claimed in claim 9, further comprising a light shielding pattern disposed on an outer surface of the substrate, between the substrate and the photo sensor device, on the photo sensor device, or a combination thereof.

16. A pixel structure of an organic electroluminescence device, comprising:
a substrate;
a first conductive layer, disposed on the substrate and comprising a first gate, a second gate, a third gate, a fourth gate and a first electrode;
a first insulating layer, covering the first conductive layer;
a semiconductor layer, disposed on the first insulating layer and comprising a first channel, a second channel, a third channel and a fourth channel;
a second conductive layer, disposed on the semiconductor layer and comprising a first source, a first drain, a second source, a second drain, a third source, a third drain, a fourth source, a fourth drain and a second electrode, wherein the first gate, the first channel, the first source and the first drain form a first switch device, the second gate, the second channel, the second source and the second drain form a driving device, the third gate, the third channel, the third source and the third drain form a second switch device, the fourth gate, the fourth channel, the fourth source and the fourth drain form a photo sensor device, and the first electrode and the second electrode form a capacitor;
a second insulating layer, covering the second conductive layer;
a bottom electrode, disposed on the second insulating layer and electrically connected to the second drain of the driving device;
a third insulating layer, disposed on the second insulating layer and exposing the bottom electrode;
an organic light emitting layer, disposed on the exposed bottom electrode; and
an upper electrode, disposed on the organic light emitting layer.

17. The pixel structure as claimed in claim 16, wherein the upper electrode comprises a transparent electrode material.

18. The pixel structure as claimed in claim 16, wherein the bottom electrode comprises a reflective electrode material or a transparent electrode material.

19. The pixel structure as claimed in claim 16, wherein the first conductive layer further comprises a scan line and a bias line, the scan line is electrically connected to the first gate, and the bias line is electrically connected to the fourth gate and the fourth drain.

20. The pixel structure as claimed in claim 16, wherein the second conductive layer further comprises a data line, a readout line and a bias line, the data line is electrically connected to the first source, the readout line is electrically connected to the third source, and the bias line is electrically connected to the second electrode and the second source.

* * * * *